(12) United States Patent
Plants et al.

(10) Patent No.: US 7,358,601 B1
(45) Date of Patent: Apr. 15, 2008

(54) ARCHITECTURE FOR FACE-TO-FACE BONDING BETWEEN SUBSTRATE AND MULTIPLE DAUGHTER CHIPS

(75) Inventors: William C. Plants, Campbell, CA (US); John McCollum, Saratoga, CA (US); Theodore Speers, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 83 days.

(21) Appl. No.: 11/171,488

(22) Filed: Jun. 29, 2005

Related U.S. Application Data

(63) Continuation-in-part of application No. 10/955,929, filed on Sep. 29, 2004.

(51) Int. Cl.
*H01L 23/02* (2006.01)

(52) U.S. Cl. ...................................... 257/686

(58) Field of Classification Search ........ 257/734–738, 257/680–691, 724–728, 777, E21.006
See application file for complete search history.

(56) References Cited

U.S. PATENT DOCUMENTS

| | | | |
|---|---|---|---|
| 6,255,729 B1* | 7/2001 | Oikawa | 257/723 |
| 6,914,259 B2* | 7/2005 | Sakiyama et al. | 257/48 |
| 7,242,093 B2* | 7/2007 | Ueda | 257/737 |
| 2001/0040281 A1 | 11/2001 | Butler | |
| 2002/0004932 A1* | 1/2002 | Shau | 716/19 |
| 2002/0008309 A1* | 1/2002 | Akiyama | 257/686 |
| 2002/0017718 A1* | 2/2002 | Hikita et al. | 257/723 |
| 2005/0205983 A1* | 9/2005 | Origasa et al. | 257/686 |
| 2005/0224942 A1* | 10/2005 | Ho | 257/685 |
| 2006/0038273 A1 | 2/2006 | Lu et al. | |
| 2006/0071332 A1 | 4/2006 | Speers | |
| 2006/0237833 A1* | 10/2006 | Klein et al. | 257/686 |

FOREIGN PATENT DOCUMENTS

| | | |
|---|---|---|
| WO | 2006039254 A2 | 4/2006 |
| WO | 2006039254 A3 | 4/2006 |

OTHER PUBLICATIONS

Anonymous, "3D Integration for Mixed Signal Applications," Ziptronix, Inc., 4 pages, 2002, no month.
Anonymous, "Benefits of 3D Integration in Digital Imaging Applications," Ziptronix, Inc., 3 pages, 2002, no month.
T. Makimoto, Ph. D., "New Opportunities in the Chip Industry," Semico Summit 2004, Scottsdale, Arizona, 40 pages, Mar. 14-16, 2004.

* cited by examiner

*Primary Examiner*—Nathan W Ha
(74) *Attorney, Agent, or Firm*—Sierra Patent Group, Ltd.

(57) ABSTRACT

An integrated circuit system includes a first integrated circuit die and a family of second integrated circuit dice. The first integrated circuit die have input/output circuits disposed thereon and further have a first array of face-to-face bonding structures disposed on a first face thereof. Each member of the family of second integrated circuit dice have logical function circuits disposed thereon and further have a second array of face-to-face bonding structures disposed on a first face thereof. The second array of face-to-face bonding structures of each member of the family mates with a different portion of the first array of face-to-face bonding structures.

14 Claims, 9 Drawing Sheets

| CT 42 | I/O 40 | I/O 40 | I/O 40 | I/O 40 | CT 42 |
|---|---|---|---|---|---|
| I/O 40 | CCT 38 | CCT 38 | CCT 38 | CCT 38 | I/O 30 |
| I/O 40 | CCT 38 | CCT 38 | CCT 38 | CCT 38 | I/O 40 |
| I/O 40 | CCT 38 | CCT 38 | CCT 38 | CCT 38 | I/O 40 |
| I/O 40 | CCT 38 | CCT 38 | CCT 38 | CCT 38 | I/O 40 |
| NVM PROGRAMMING BLOCK 44 | | | | OTHER 46 | I/O 40 |
| OTHER 46 | | | | | |
| CT 42 | I/O 40 | I/O 40 | I/O 40 | I/O 40 | CT 42 |

ARCHITECTURE FOR FACE-TO-FACE BONDING BETWEEN SUBSTRATE AND MULTIPLE DAUGHTER CHIPS

RELATED APPLICATIONS

This application is a continuation-in-part of co-pending application Ser. No. 10/955,929, filed Sep. 29, 2004, entitled "FACE-TO-FACE BONDED I/O CIRCUIT DIE AND FUNCTIONAL LOGIC CIRCUIT DIE SYSTEM" and assigned to the same assignee as the present invention.

BACKGROUND OF THE INVENTION

1. Field of the Invention

The present invention relates to user-programmable integrated circuits. More particularly, the present invention relates to a substrate architecture for face-to-face bonding to multiple daughter chips.

2. The Prior Art

As process geometries scale, the portion of the area of digital-logic function integrated circuits such as field-programmable-gate-array (FPGA) integrated circuits and mixed digital and analog function integrated circuits that must be devoted to input/output (I/O) represents an increasing percentage of the die area relative to logic gates. A secondary cost issue is that often customers may need a significant amount of I/O and not many gates. Presently, such customers end up paying for un-needed gates in order to obtain needed I/O. The reverse is true as well. This represents an opportunity to deliver a more cost-effective product to customers.

Another problem is that some manufacturers envision creating a number of system-on-a-chip (SOC) integrated circuits and derivatives that employ FPGA and other programmable logic technology. These derivatives will have varying quantities and functions of analog peripherals depending on application. Many variations of analog peripherals are envisioned. In addition, the number of FPGA gates needed for each set of peripherals will be customer dependent, again creating a situation where the customer is paying for un-needed gates.

The industry has not come up with a good solution for the I/O problem to date. The current trend is to make several I/O rings and offer variations of products in different combinations with different gate counts. Another solution is to use so-called I/O immersion where I/Os can be programmed anywhere in the FPGA fabric, thereby decoupling the number of I/O circuits from the number of logic gates. This solution however requires flip-chip packaging. Flip-chip packaging is the art of bonding pads distributed anywhere on the face of an IC directly to a package without use of wires. Flip-chip packaging, presently and in the reasonably-forseeable future, will still add enough cost to the product to offset any cost savings realized from the solution.

The industry in general is looking at a number of so-called 3-D packaging variations. None of these variations are employing 3D packaging to solve the above-described I/O problem.

BRIEF DESCRIPTION OF THE INVENTION

An integrated circuit system includes a first integrated circuit die and a family of second integrated circuit dice. The first integrated circuit die have input/output circuits disposed thereon and further have a first array of face-to-face bonding structures disposed on a first face thereof. Each member of the family of second integrated circuit dice have logical function circuits disposed thereon and further have a second array of face-to-face bonding structures disposed on a first face thereof. The second array of face-to-face bonding structures of each member of the family mates with a different portion of the first array of face-to-face bonding structures.

According to one aspect of the invention, the first array of face-to-face bonding structures is organized as a plurality of tiles and the second array of face-to-face bonding structures of each member of the family of second integrated circuit dice is an integral number of the tiles.

According to another aspect of the invention, first integrated circuit die may further include circuits other than input/output circuits.

According to another aspect of the invention, there may be more than one first integrated circuit die, each one having a different number of input/output circuits.

According to another aspect of the invention, each member of the family of second integrated circuit dice may have programmable circuits, such as FPGA circuits, disposed thereon, and may further include circuits other than programmable circuits.

BRIEF DESCRIPTION OF THE DRAWING FIGURES

FIGS. 2A through 2D are schematic representations of tiled layout schemes for a family of substrates in accordance with one aspect of the present invention.

DETAILED DESCRIPTION OF THE INVENTION

Figure 1:
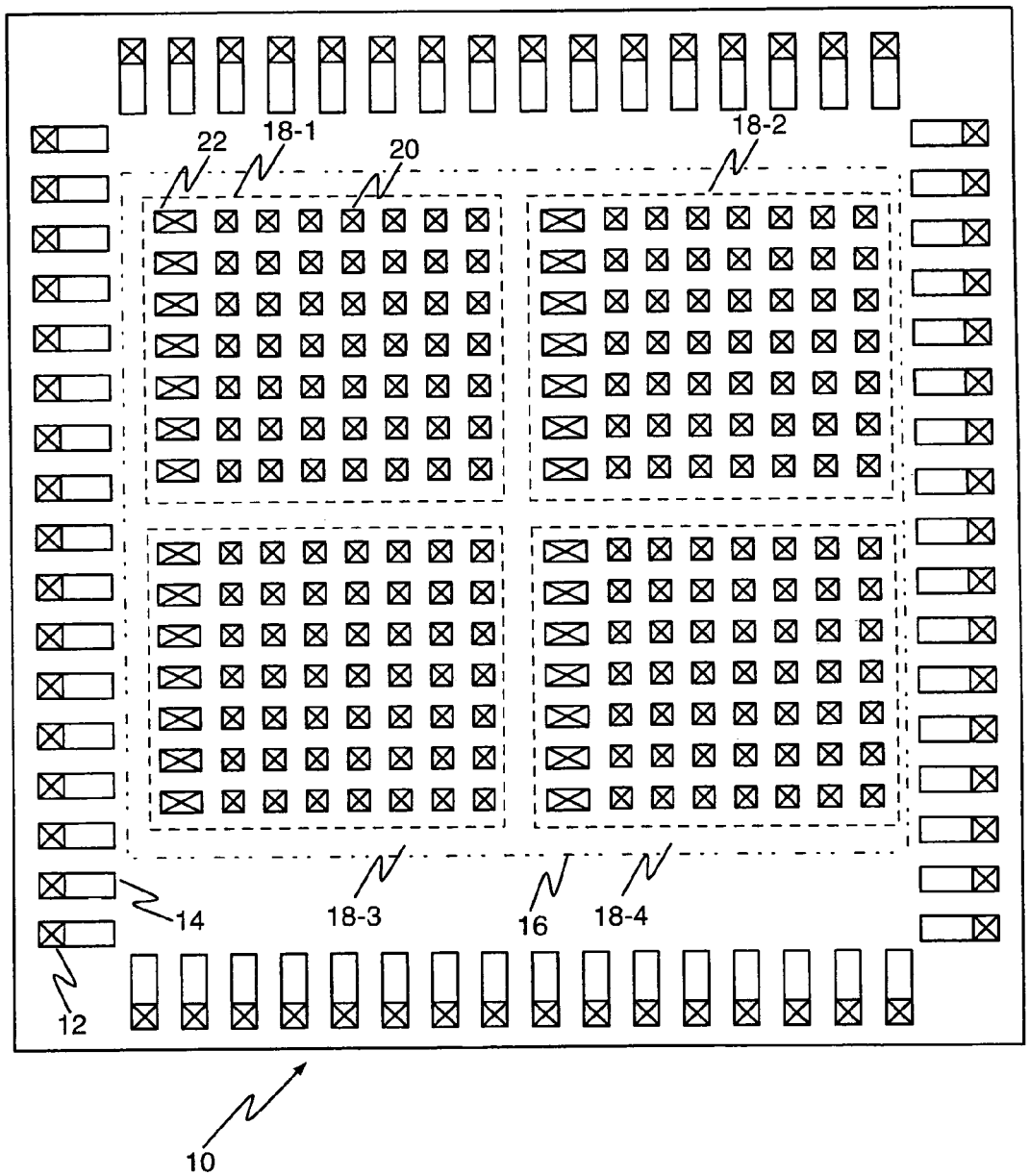
FIG. 1 is a top view of an illustrative substrate according to the present invention showing an exemplary layout for the I/O pads for connection of the daughter chips and the I/O pads for making external connections to the substrate.

Persons of ordinary skill in the art will realize that the following description of the present invention is illustrative only and not in any way limiting. Other embodiments of the invention will readily suggest themselves to such skilled persons.

The present invention employs a low-cost substrate to carry face-to-face mounted daughter chips which can be fabricated in a high-cost state-of-the-art process. The idea is to build an FPGA family in a modular fashion in order to save research and development and non-recurring engineering costs while providing a way to nimbly create derivative parts in response to market conditions.

The I/O circuit portion of an FPGA can be manufactured on mature processes because, among other reasons, a system designer requires higher voltages for signals sent off-chip (e.g., to other components on a printed circuit) board signaling than that needed for the FPGA core. Wafer prices for circuits manufactured using such mature processes are typically steeply discounted relative to leading-edge processes. For example, at a time when 90 nm feature size is the leading edge of FPGA processes, an I/O chip for a 90 nm FPGA device may be produced using a 180 nm process.

According to the present invention, an integrated circuit system includes a plurality of first integrated circuit substrates including I/O circuits, each one having a different I/O count. The I/O circuits may preferably be located on the periphery of the die and are available for wire bonding. The I/O circuits may preferably be fabricated using a mature process node.

The integrated circuit system of the present invention also includes a plurality of second integrated circuit dice. The second integrated circuit dice may include digital programmable logic device circuits, each one having a different gate count. The digital integrated circuits may preferably be fabricated using a leading-edge process node. In addition, the second integrated circuit dice may include circuitry other than digital programmable logic device circuits. For example, such circuits may include volatile and non-volatile memory arrays and other fixed-function digital circuits of any nature.

Face-to-face bonding pads on each of the first and second integrated circuit dice are disposed in the center portion of the first and second integrated circuit die. The face-to-face bonding pads on each of the first and second integrated circuit dice are matingly located with respect to one another and are distributed so that a second integrated circuit die, for example an FPGA which may preferably be fabricated using a leading-edge process so as to minimize cost/gate, can be bonded to the first IO die. The face-to-face bonding pads may be disposed in a layout pattern that allows different gate-count FPGA integrated circuit die to be face-to-face bonded to different I/O circuit die.

According to the present invention, a device manufacturer can offer customers choices of purchasing various numbers of I/Os for a product with a given gate count, without having to manufacture different versions of that product at the wafer level. In this way, a customer could purchase a product having both a desired gate count and a desired number of I/Os, without having to compromise cost by purchasing an un-needed number of one in order to obtain the desired number of the other. As will be appreciated by persons of ordinary skill in the art, the present invention applies to application specific integrated circuit (ASIC) integrated circuits, system-on-a-chip (SOC) integrated circuits or other functional types of integrated circuits in addition to programmable logic devices such as FPGAs.

Referring first to FIG. 1, a top view is shown of an illustrative input/output integrated circuit die 10 that may be used in an integrated circuit system according to the principles of the present invention. Input/output integrated circuit die 10 includes a plurality of I/O pads 12 disposed about its periphery as is known in the art. These I/O pads may be used to accept connecting wires that may be attached using integrated-circuit wire-bonding techniques to make connections through an integrated-circuit package (not shown in the figure) to off-chip circuitry as is known in the art. The package seals the integrated circuit to protect it from the outside environment, as is known in the art.

The I/O pads 12 are electrically connected to I/O circuits 14. I/O circuits 14 may include buffers, level-shifting circuits and other digital signal conditioning circuitry as is known in the art. The particular composition of the I/O circuits 14 in an integrated circuit fabricated according to the principles of the present invention will be a matter of design choice made by persons of ordinary skill in the art and dictated by the application in which the integrated circuit system of the present invention is used.

Programming registers may be disposed within or coupled to the input/output circuits 14 to define such functions and parameters as is known in the art. As will be appreciated by persons of ordinary skill in the art, such programming registers are in general use in the industry and the loading of the programming registers can be accomplished by using techniques known for programming such programmable registers and programmable logic devices in general. Such techniques include, but are not limited to, coupling the registers together to a JTAG port on the integrated circuit die 10 that is coupled to the input/output pads, coupling the registers to other circuitry to be programmed and located on the integrated circuit die 10 or on the integrated circuit to be mated with the input/output circuit integrated circuit die 10. The registers could be coupled to, for example, an FPGA programming circuit contained on the integrated circuit die 10 or on the logic-function integrated-circuit die to which the integrated circuit die 10 of FIG. 1 will be mated through the face-to-face interface. The register bits could be loaded from non-volatile memory such as flash memory disposed on the integrated circuit die 10 or on the logic-function integrated-circuit die to which the integrated circuit substrate of FIG. 1 will be mated through the face-to-face interface.

Depending on the I/O density required by the application, the input/output circuits 14 may be arranged in more than one concentric "ring" with the outermost one of the rings being located inward from the edges of the integrated circuit die, and the next ring being located inward of the input/output circuits in the outer ring. FIG. 1 shows only a single ring of I/o circuits.

The particular layout used for the input/output circuits on the substrate 10 of the present invention is a matter of design choice but it is presently preferred to group pluralities of such circuits into I/O "tiles" as will be disclosed with reference to FIGS. 2A through 2D herein.

Also included on input/output integrated circuit die 10 is a daughter-die mounting area 16 containing a plurality of arrays of face-to-face bonding pads. In FIG. 1, four such arrays of face-to-face bonding pads are shown disposed within the daughter-die mounting area 16 and are indicated at reference numerals 18-1 through 18-4. These arrays of face-to-face bonding pads may be fabricated and configured as is known in the art of face-to-face integrated circuit bonding techniques. The number of face-to-face bonding pads that will be used in an array of face-to-face bonding pads in the integrated circuit system of the present invention is a mater of design choice dictated by the connectivity needs encountered in the system. The placement pattern of the face-to-face bonding pads in the array of face-to-face bonding pads is not critical and need only be configured to permit mating face-to-face bonding pads of one or more second integrated circuit die to be face-to-face bonded to input/output integrated circuit die 10. The pitch of the array of bonding pads 16 may be, for example, an aggressive 30 micron pitch, or a less aggressive pitch, such as 60 microns, depending on the number of connections that need to be made between substrate 10 and the one or more daughter chips that will be face-to-face bonded to it. The arrays 18-1 through 18-4 are spaced apart so as to accommodate the scribe boundaries of the daughter dice to be mounted thereon. The individual I/O pads in the arrays 18-1 through 18-4 allow for making contacts to the I/O circuits 14, to any functional circuitry disposed on the substrates, and to make interconnections between different daughter chips that will be coupled to the substrate using the I/O arrays 18-1 through 18-4.

As shown in FIG. 1, the arrays of bonding pads 18-1 through 18-4 include smaller bonding pads 20 and larger bonding pads 22. The larger bonding pads 22 are also used to make face-to-face interconnections to the daughter chips and are physically placed so as to mate with a set of probe pads located on the daughter chips. The probe pads 22 are provided on the daughter chips so that they can be tested at wafer sort. The pitch and placement of face-to-face bonding pads 22 with respect to the main array of face-to-face bonding pads 20 is a matter of design choice. Such pitch and placement will depend on many factors, such as the number of and different sizes of daughter chips that can be accommodated by a substrate as will be disclosed herein. In addition, while four arrays of bonding pads 18-1 through 18-4 are shown in a 2×2 array in FIG. 1 for purposes of illustration, persons of ordinary skill in the art will appreciate that other numbers and array configurations are contemplated according to the present invention. Therefore, the particular example shown in FIG. 1 is to be understood as merely illustrative and not limiting.

Referring now to FIGS. 2A through 2D, schematic representations show tiled layout schemes for a family of substrates in accordance with one aspect of the present invention. Each substrate has the interconnection attributes of substrate 10 depicted in FIG. 1. Each substrate is "tiled" in that circuitry disposed on the substrate is divided into standard tiles that may be stepped and repeated across the substrate.

FIGS. 2A through 2D show several different types of tiles disposed on substrates 30, 32, 34, and 36, respectively in FIGS. 2A, 2B, 2C, and 2D. As may be seen from an examination of FIGS. 2A through 2D, the difference between substrates 30, 32, 34, and 36 is that they are progressively larger and can thus accommodate larger or more numerous daughter chips. These tile types are given the same reference numerals having the same prefixes in all of FIGS. 2A through 2D. The tiles can be square, but do not have to be square. An illustrative size of 1 mm² is an example but persons of ordinary skill in the art will observe that this is merely a suggestion and that other sizes and aspect ratios are possible. The 1 mm² die is illustrative only. The exact size in a real product may be determined by a Rent's rule analysis or other factors.

Figure 2A:
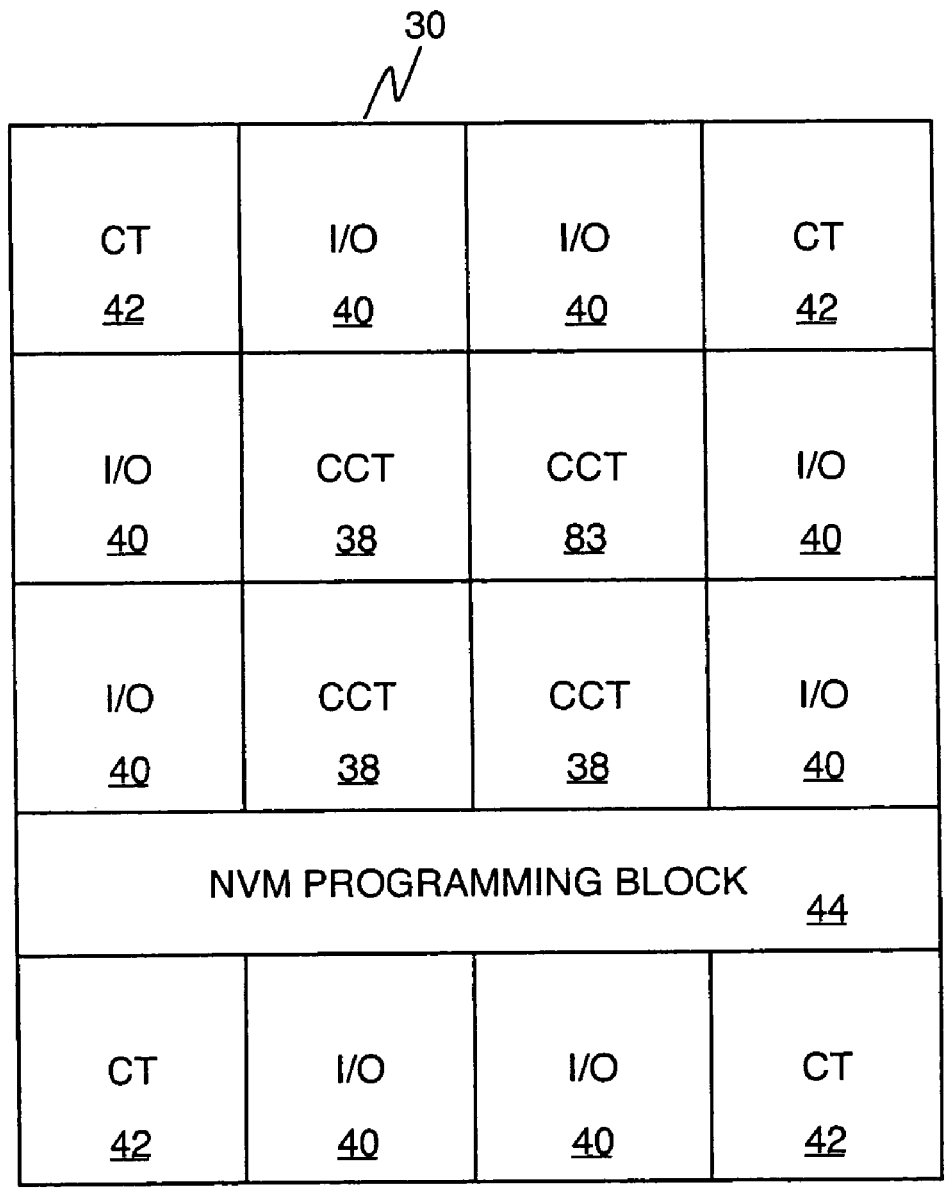
Figure 2B:
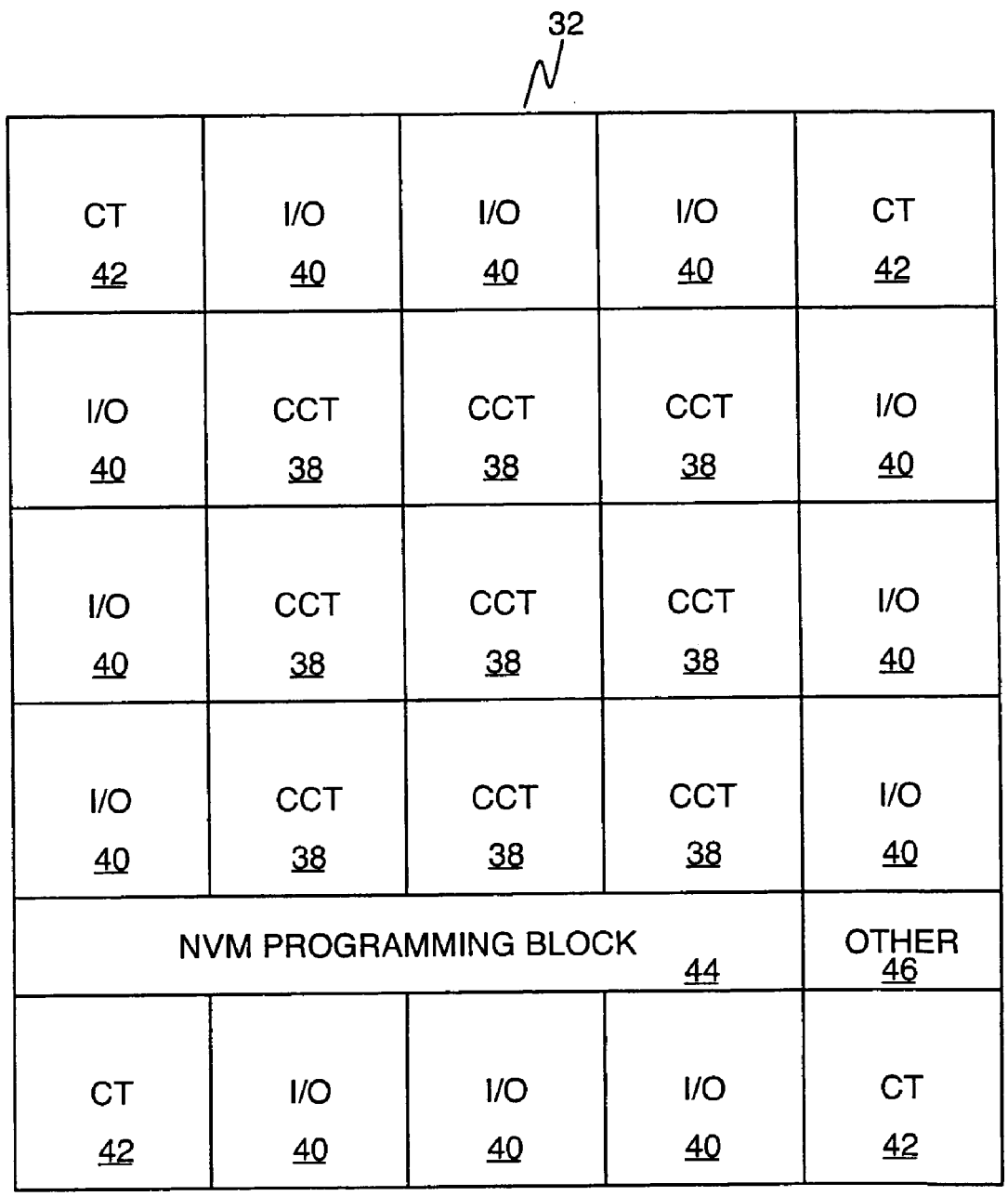
Figure 2D:
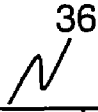

In the embodiment shown in FIG. 2A, Core Connect Tiles (CCTs) 38 are shown disposed at the center where the daughter chips are to be mounted to the substrate. FIG. 2A shows four CCTs 38 disposed in a 2×2 array, FIG. 2B shows nine CCTs 38 disposed in a 3×3 array, FIG. 2C shows sixteen CCTs 38 disposed in a 4×4 array, and FIG. 2D shows twenty-five CCTs 38 disposed in a 5×4 array. The portion of the daughter-die mounting area 16 associated with an exemplary CCT 38 is shown in FIG. 1 as the portion of the array of bonding pads within the dashed squares 18-1 through 18-4.

Another type of tile is an I/O tile 40. Each I/O tile 40 includes a plurality of the input/output circuits 14 of FIG. 1. As disclosed with reference to FIG. 1, the input/output circuits may include buffers, level-shifting circuits and other digital signal conditioning circuitry as is known in the art. As is known in the programmable logic device art, the input/output circuits 14 may be configured as a mix of fixed input circuits and output circuits or may be configurable as to one or more of input or output function, logic level definition, signal conditioning, etc., as is known in the art. The programming of these functions may be set by register bits. The programming registers may either be contained within each programmable input/output circuit or may be configured separately as programming registers, or may be defined using non-volatile memory disposed on the substrate. The particular composition of the input/output circuits in an integrated circuit fabricated according to the principles of the present invention will be a matter of design choice made by persons of ordinary skill in the art and dictated by the application in which the integrated circuit system of the present invention is used.

A third type of tile is shown in FIGS. 2a through 2D as a corner tile (CT) 42. The CTs 42 need not all be the same and may be any type of analog or digital functional circuits, including programmable logic circuits such as FPGA circuits. They may even be additional I/O circuit tiles depending on the richness of the I/O that is necessary.

In the embodiments shown in FIGS. 2A through 2D, substrates 30, 32, 34, and 36 also include a non-volatile memory (NVM) programming tile 44 that includes the NVM analog support circuitry for programming non-volatile memory cells on either the mother or daughter chips. The non-volatile memory may be a block of non-volatile memory such as flash memory located on either the mother or daughter chips and employed as user memory or otherwise used by the FPGA portion of the device. The non-volatile memory cells may also store the configuration information for the programmable logic portion of the programmable logic device. For example, the non-volatile memory cells may comprise a block of non-volatile memory that holds the configuration information for the logic cells of a volatile-memory based programmable logic device such as an SRAM FPGA. The non-volatile memory cells may also be distributed throughout the programmable logic device and used to control directly the logic configuration, such as in the ProASIC line of FPGA products, available from Actel Corporation, Mountain View, Calif.

A tile type designated as "other" 46 allows other types of circuit functions to be integrated into the system of the present invention. There is virtually no limit to the additional types of circuits providing different analog, digital, and mixed analog and digital functions that can be tiled into the present invention for use in the various sized substrates 30, 32, 34, and 36. A non-exhaustive list of such circuits includes, analog system-on-a-chip type circuits, large SRAM blocks, DSP circuits, CPU and other microcontroller circuits, high-speed busses, such as VSIA, Sonics, etc.

Persons of ordinary skill in the art will observe that the various tiles preferably have the same form factor. This allows the entire family of integrated circuit substrates to be designed using the same tile block layouts, thus producing significant design-cost savings. For example, persons of ordinary skill in the art will observe that the non-volatile memory programming circuits 46 are the same tile size in the embodiments of FIGS. 2A through 2D as are the two types of "other" tiles 46.

Persons skilled in the art will also appreciate that, since the CCTs 38 are interconnects that use almost no silicon area on the substrate, the CCT substrate area can be used for other circuitry, such as the non-volatile memory circuitry, which will vary in size as a function as the number of CCTs 38 used on a substrate. This means that a lot of silicon area in the CCTs is free to implement analog overhead, CPUs, SRAMs, PROMs, DSPs, logic IPS, etc.

The other component in the system of the present invention is a family of daughter chips. FIGS. 3A through 3D are schematic representations of exemplary tiled layout schemes for a family of multi-tile daughter-chip FPGA circuits that mate with members of the family of substrates from FIGS. 1A through 1D.

The daughter chips can be any size that is an integer multiple of the size in the X direction and the Y direction of the CCTs 38 on the substrates. The daughter chips match up with the CCTs 38 of FIGS. 2A through 2D and are fabricated with face-to-face bonding pad arrays that are mirror images of the face-to-face bonding pad arrays 18-1 through 18-4 of FIG. 1. Again, FIG. 1 shows (at reference numeral 18-1), an illustrative face-to-face bonding pad footprint of a single CCT 38. Persons of ordinary skill in the art will appreciate that the illustrative 7×7 bonding pad array footprint is probably quite small considering the capabilities of modern technology and is for illustration only and that the size of the array will vary as a function of the particular design. For example, a 1 mm² tile could accommodate a 30 by 24 matrix of face-to-face 15 micron by 15 micron bonding pads at a 30 micron pitch (720 bonding pads).

Figure 3A:
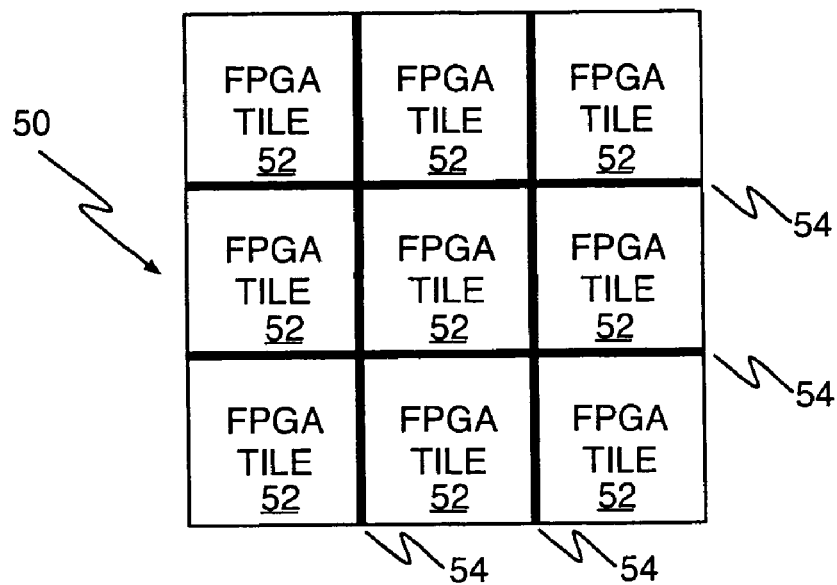
FIGS. 3A through 3E are schematic representations of tiled layout schemes for a family of multi-tile FPGA circuits that mate with members of the family of substrates from FIGS. 2A through 2D.

Referring first to FIG. 3A, a daughter chip 50 comprising a 3×3 CCT group of FPGA tiles 52 is shown. Each FPGA tile 52 has an array of face-to-face bonding pads that is a mirror image of the array shown at reference numeral 38 of FIG. 1. Each FPGA tile may include a plurality of FPGA elements. The number of elements that may be accommodated on a single FPGA tile is a function of the minimum process geometry, the nature of the FPGA elements, such as lookup tables (LUTs), flip-flops, etc., the type of programmable logic technology (e.g., SRAM, antifuse, flash, etc.) and the area of the tile, subject to Rent's Rule analysis as is known in the art. The composition of each FPGA tile is simply a matter of design choice and is beyond the scope of the present invention.

In addition, the 3×3 CCT group of FPGA tiles of FIG. 3A may be divideable by scribing along horizontal and vertical scribe lines 54 as is known in the art. Thus a single 3×3 CCT group of FPGA tiles 50 may be used to fabricate a system that has anywhere from one to nine FPGA tiles, resulting in an entire family of sizes of FPGA integrated circuit systems, including, any number of individual tiles (although this may create more yield issues than other embodiments), a 1×2 CCT-group array, a 1×3 CCT-group array, a 2×2 CCT-group array, a 2×3 CCT-group array, or a 3×3 CCT-group array of FPGA tiles, thus providing a product family having a wide variety of gate counts that uses the same substrate and daughter chip components.

Figure 3C:
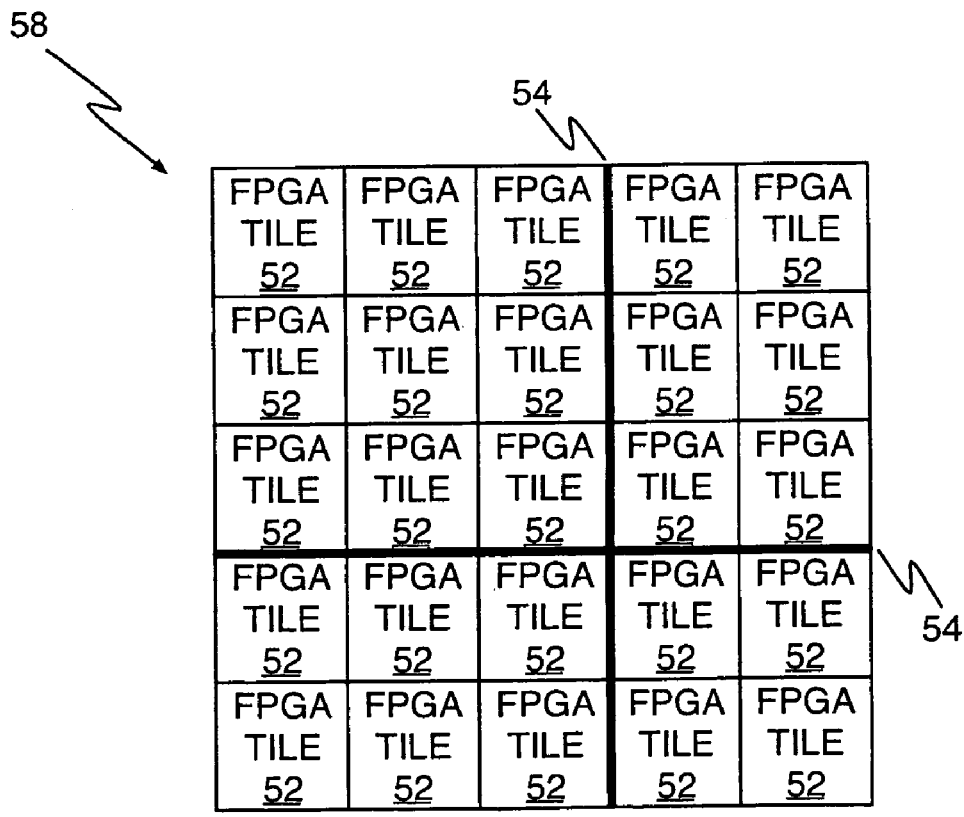
Figure 3B:
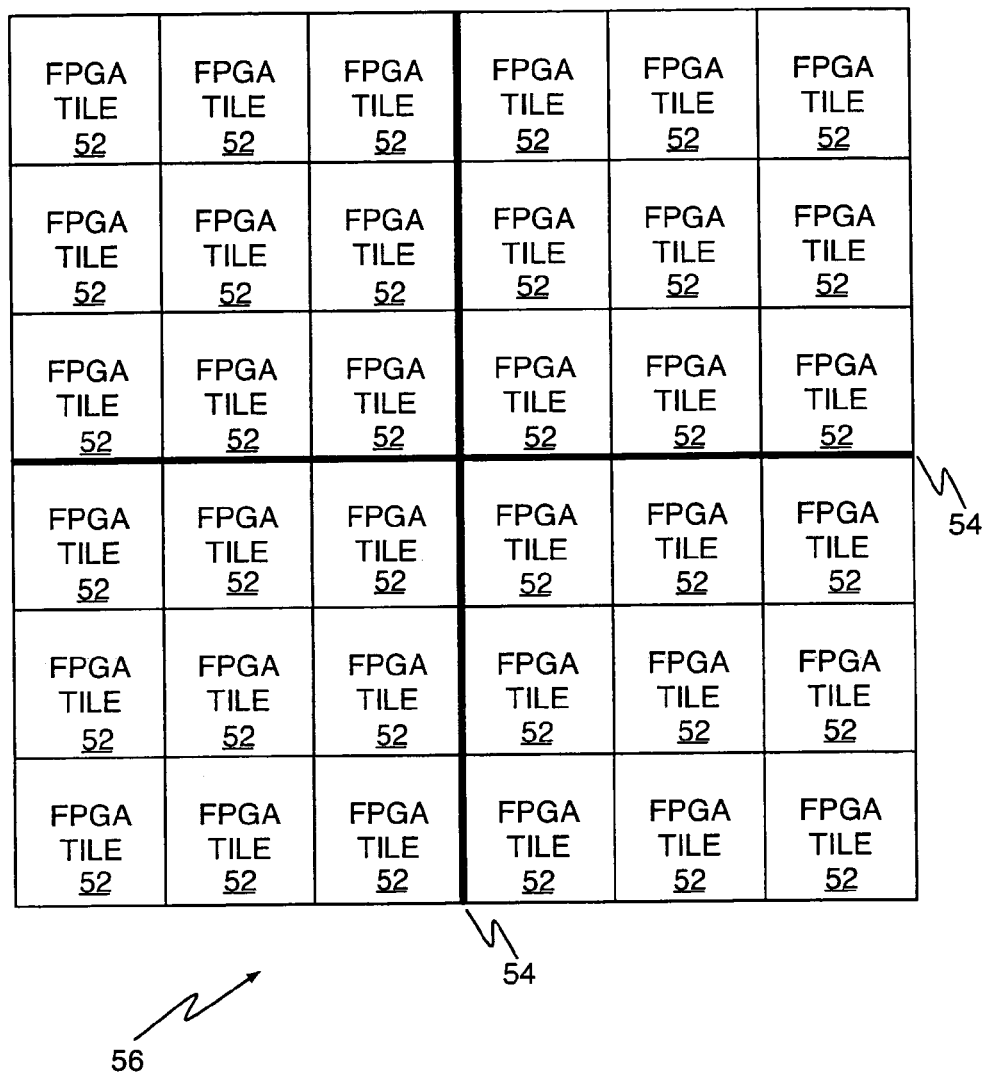
Figure 3D:
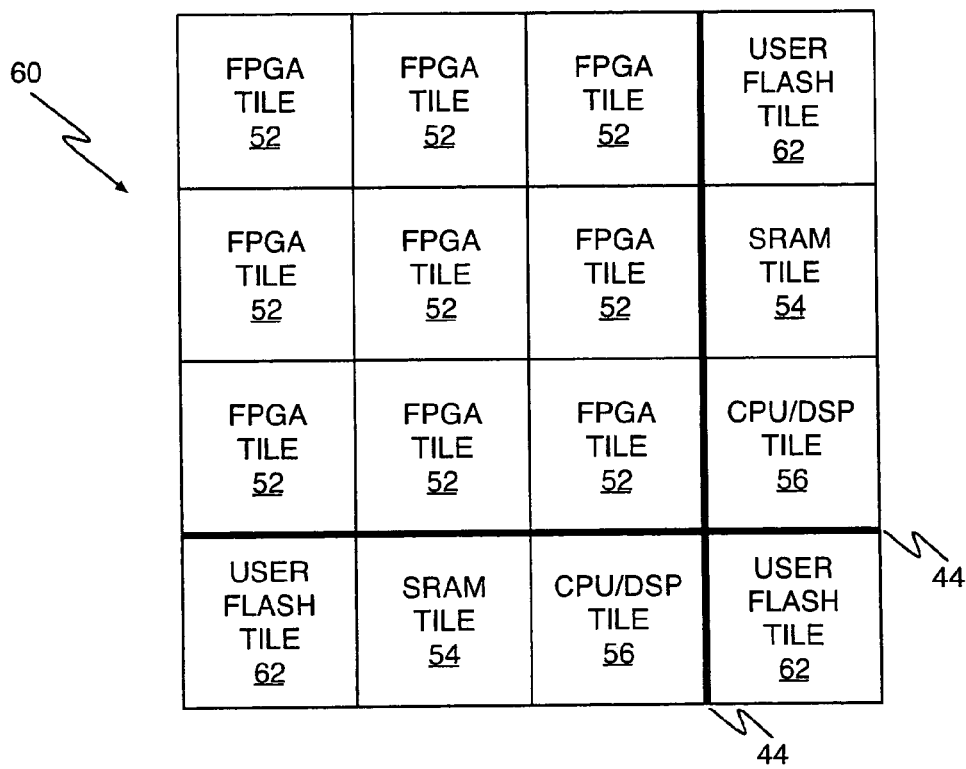

Similar illustrative groups of FPGA tiles are shown in FIGS. 3B through 3D. In FIG. 3B, a 6×6 CCT group 56 of FPGA tiles 52 is shown with horizontal and vertical scribe lines 54, allowing the group to be divided into four 3×3 CCT groups. Each CCT group could be used to completely fill the CCT area in the substrate of FIG. 2B.

In FIG. 3C, a 5×5 CCT group 58 of FPGA tiles 52 is shown with horizontal and vertical scribe lines 54, allowing the group to be divided into one 3×3 CCT group, one 2×3 CCT group, one 3×2 CCT group, and one 2×2 CCT group.

In FIG. 3D, a 4×4 CCT group 60 is shown that includes a 3×3 CCT group of FPGA tiles 52, three user flash tiles 62, two SRAM block memory tiles 64, and two CPU/DSP tiles 66. The entire CCT group could be bonded to the substrate of FIG. 2C. In addition, horizontal and vertical scribe lines 54 allow the group of FIG. 3D to be divided in several different ways as shown.

Figure 3E:
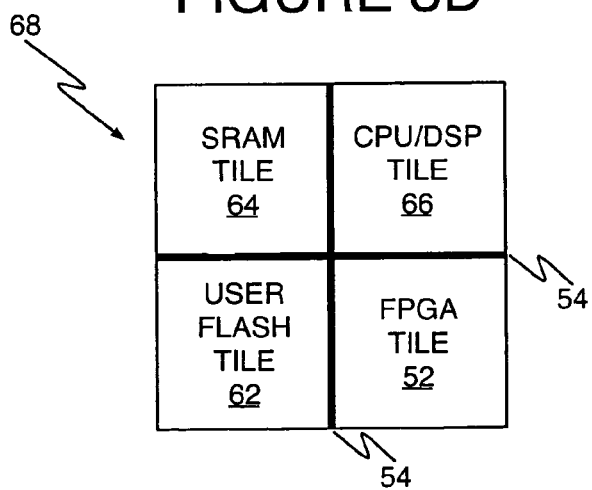

Finally, in FIG. 3E, a 2×2 CCT group 68 is shown that includes a single FPGA tile 52, a single user flash tile 62, a single SRAM block memory tile 64, and a single CPU/DSP tile 66. This CCT group can be scribed along horizontal and vertical scribe lines 54 or may be used as a single daughter chip in any substrate that has capacity to accept a 2×2 CCT group.

Persons of ordinary skill in the art will appreciate that the configurations for the daughter chips shown in FIGS. 3A through 3E are merely illustrative and that there is virtually no limit to the additional types of circuits providing different analog, digital, and mixed analog and digital functions that can be tiled into the present invention for use in the various sized substrates daughter chips. A non-exhaustive list of such circuits includes, analog system-on-a-chip type circuits, large SRAM blocks, DSP circuits, CPU and other microcontroller circuits, high-speed busses, such as VSIA, Sonics, etc.

As may be understood from an examination of FIGS. 3A through 3E, there are many possibilities for combining any of the substrates of FIGS. 2A through 2D with the daughter chips (or subcombinations of the daughter chips) of FIGS. 3A through 3D.

When the versatility of the daughter chip arrangements of the present invention is combined with the versatility of the substrate components, the possibilities increase dramatically. For example, the substrate of FIG. 2A can accept up to a 2×2 daughter FPGA chip or four single-CCT footprint chips. The substrates of FIGS. 2B through 2D can be seen to accommodate up to 3×3, 4×4, and 5×5 CCT daughter-chip footprints or any combination of smaller daughter chips that will fit.

Figure 4:
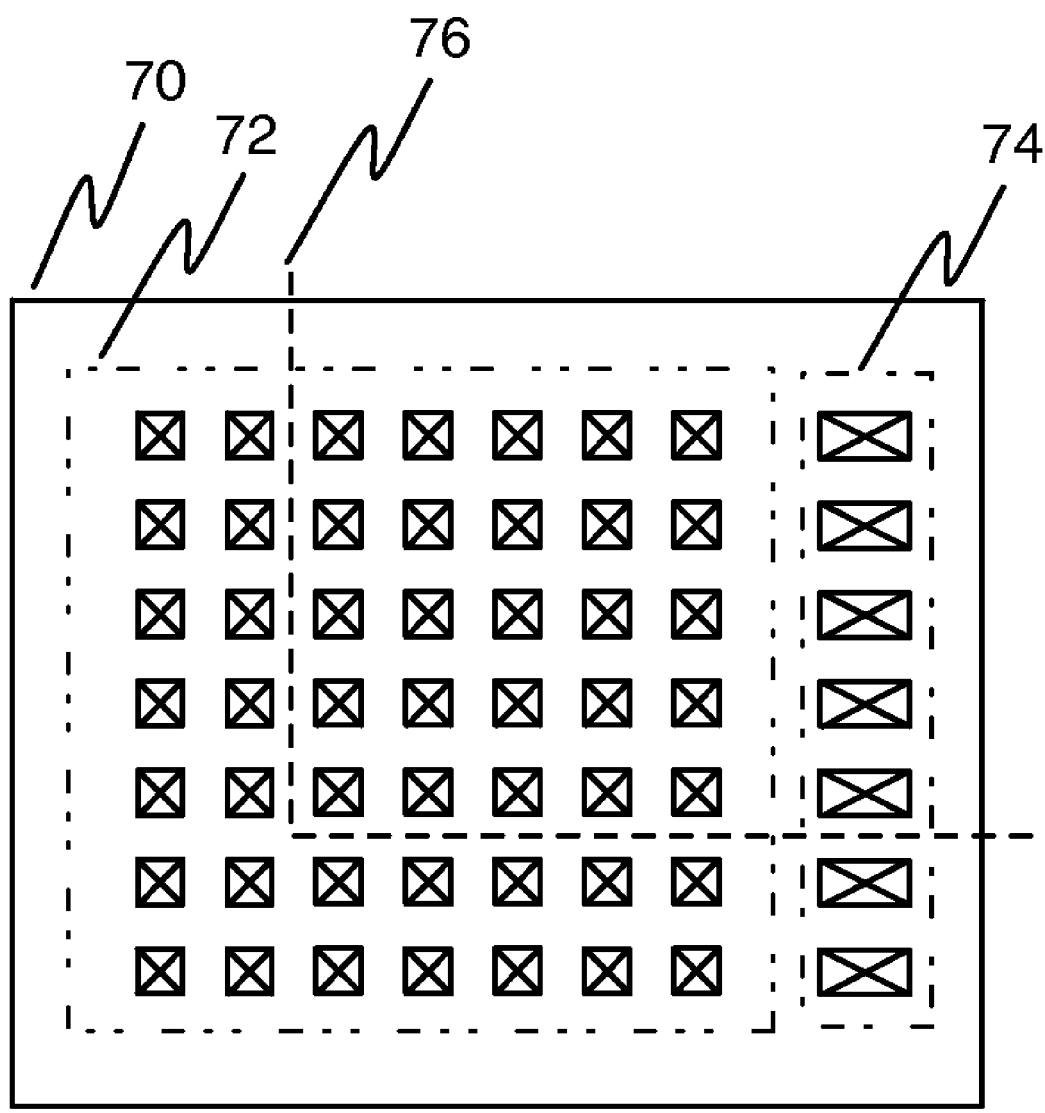
FIG. 4 is a top view of an illustrative daughter chip according to the present invention.

Referring now to FIG. 4, a top view is shown of an illustrative daughter chip 70 that may be used in an integrated circuit system according to the principles of the present invention. FIG. 4 shows the top of daughter chip 70 to include an array of face-to-face bonding pads 72. The array of face-to-face bonding pads 72 is a mirror image of the array of face-to-face bonding pads 18-1 through 18-4 of FIG. 1 and therefore each bonding pad in the array 72 mates exactly with its counterpart in the arrays 18-1 through 18-4 of FIG. 1. FIG. 4 also shows another array 74 of face-to-face bonding pads. The array of face-to-face bonding pads 74 is a mirror image of the arrays of face-to-face bonding pads 18-1 through 18-4 of FIG. 1 and therefore each bonding pad in the array 74 mates exactly with its counterpart in the arrays 18-1 through 18-4 of FIG. 1. It will be recalled that the bonding pads in the array 74 may be used for testing the daughter chip 70 at wafer sort and then can be used to provide connections from the substrate of FIG. 1 to circuit nodes on the daughter chip 70. According to one aspect of the present invention, the second array of face-to-face bonding structures of each member of the daughter chip family mates with a different portion of the first array. Dashed line 76 indicates the boundary of a smaller daughter chip that may be mated with the chip of FIG. 1.

According to another aspect of the present invention, daughter chips like those of FIG. 3A through FIG. 3D may have interconnect lines running across scribe-line boundaries indicated by lines 54 in those drawing figures. The advantage to providing interconnect lines that transect scribe-line boundaries is the reduction of the number of face-to-face bonding pads that are necessary to connect a daughter chip that remains undivided across scribe-line boundaries. If two otherwise divideable portions of a daughter chip are left intact, the interconnect lines that traverse the scribe-line boundaries of the two portions of the daughter chip can be advantageously used, resulting in faster and more efficient chip operation. This aspect of the present invention is disclosed in U.S. Pat. No. 7,224,042, which application is expressly incorporated by reference herein.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit system including:
a first integrated circuit die having input/output circuits disposed thereon and further having a first array of face-to-face bonding structures disposed on a first face thereof, the first integrated circuit die having no digital programmable logic circuits disposed thereon;
a family of second integrated circuit dice, each member of the family having digital programmable logic circuits disposed thereon and each member of the family having a size that is an integer multiple of a unit-tile size in each of an X and Y direction, further having a second array of face-to-face bonding structures disposed on a first face thereof, the second array of face-to-face bonding structures of each member of the family mates with different portion of the first array of face-to-face bonding structures, each member of the family having no input/output circuits disposed thereon.

2. The integrated circuit system of claim 1 wherein input/output circuits are disposed in a peripheral portion of the first integrated circuit die and the mating face-to-face bonding pads are disposed on the opposing face of the first integrated circuit die at an interior portion thereof.

3. The integrated circuit system of claim 1 wherein the digital programmable logic circuits on each member of the family of the second integrated circuit dice include a field programmable gate array having a different gate-count.

4. The integrated circuit system of claim 1 further including additional circuits disposed under the mating face-to-face bonding pads of the first integrated circuit die.

5. The integrated circuit system of claim 4 wherein the additional circuits include a digital-to-analog converter circuit.

6. The integrated circuit system of claim 4 wherein the additional circuits include an analog-to-digital converter circuit.

7. The integrated circuit system of claim 4 wherein the additional circuits include a voltage-regulator circuit.

8. The integrated circuit system of claim 4 wherein the additional circuits include a field-programmable-gate-array programming-control circuit.

9. The integrated circuit system of claim 4 wherein the additional circuits include at least one charge-pump circuit.

10. The integrated circuit system of claim 4 wherein the additional circuits include a data-conditioning circuit.

11. The integrated circuit system of claim 10 wherein the data-conditioning circuit comprises a serdes circuit.

12. The integrated circuit system of claim 11 wherein the data-conditioning circuit comprises a bus-interface circuit.

13. The integrated circuit system of claim 1 wherein the first array of face-to-face bonding structures is organized as a plurality of tiles and wherein the second array of face-to-face bonding structures of each member of the family of second integrated circuit dice is an integral number of the tiles.

14. An integrated circuit system comprising:
a mother integrated circuit die, including a substrate, input/output circuits disposed on the substrate, and an array of face-to-face bonding structures disposed on a surface of the substrate and organized into repeatable tiles, and adapted to receive a first daughter integrated circuit die and a second daughter integrated circuit die via face to face bonding at the array of bonding structures, the mother integrated circuit die having no digital programmable logic circuits disposed thereon; and
at least one first and second daughter integrated circuit dice including digital programmable logic circuits each connectable to the mother integrated circuit die via one of the tiles of bonding structures on the mother integrated circuit die, each at least one first and second daughter integrated circuit die having a size that is an integer multiple of a unit-tile size in each of an X and Y direction, and further having no input/output circuits disposed thereon.

* * * * *